(12) United States Patent
Hazel et al.

(10) Patent No.: US 8,632,890 B2
(45) Date of Patent: *Jan. 21, 2014

(54) NICKEL ALUMINIDE COATING SYSTEMS AND COATED ARTICLES

(75) Inventors: Brian Thomas Hazel, Cincinnati, OH (US); Don Mark Lipkin, Niskayuna, NY (US); Michael Howard Rucker, Cincinnati, OH (US); Rudolfo Viguie, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 367 days.

This patent is subject to a terminal disclaimer.

(21) Appl. No.: 12/827,938

(22) Filed: Jun. 30, 2010

(65) Prior Publication Data

US 2011/0151274 A1 Jun. 23, 2011

Related U.S. Application Data

(60) Provisional application No. 61/288,711, filed on Dec. 21, 2009.

(51) Int. Cl.
*B32B 15/00* (2006.01)
(52) U.S. Cl.
USPC ........... 428/652; 428/633; 428/680; 428/941; 148/537; 148/535
(58) Field of Classification Search
None
See application file for complete search history.

(56) References Cited

U.S. PATENT DOCUMENTS

| | | | |
|---|---|---|---|
| 4,101,715 A | 7/1978 | Rairden, III | |
| 6,153,313 A | 11/2000 | Rigney et al. | |
| 6,255,001 B1 | 7/2001 | Darolia | |
| 6,455,167 B1 * | 9/2002 | Rigney et al. | 428/472.2 |
| 6,544,665 B2 | 4/2003 | Rigney et al. | |
| 6,569,492 B2 * | 5/2003 | Fernihough et al. | 427/142 |
| 6,579,627 B1 | 6/2003 | Darolia et al. | |
| 6,964,791 B2 | 11/2005 | Zhao et al. | |
| 7,311,981 B2 * | 12/2007 | Saint Ramond et al. | 428/632 |
| 7,335,429 B2 | 2/2008 | Lee et al. | |
| 7,413,778 B2 * | 8/2008 | Gorman et al. | 427/383.7 |
| 2002/0094448 A1 | 7/2002 | Rigney et al. | |

(Continued)

FOREIGN PATENT DOCUMENTS

| | | |
|---|---|---|
| EP | 1652959 A1 | 5/2006 |
| EP | 1652968 A1 | 5/2006 |
| EP | 1944387 A1 | 7/2008 |

OTHER PUBLICATIONS

WO Search Report issued in connection with corresponding WO Patent Application No. US10/60702 filed on Dec. 16, 2010.

*Primary Examiner* — John J Zimmerman
(74) *Attorney, Agent, or Firm* — William Scott Andes; Gary M. Hartman; Domenica N.S. Hartman

(57) ABSTRACT

A method for forming a nickel aluminide based coating on a metallic substrate includes providing a first source for providing a significant portion of the aluminum content for a coating precursor and a separate nickel alloy source for providing substantially all the nickel and additional alloying elements for the coating precursor. Cathodic arc (ion plasma) deposition techniques may be utilized to provide the coating precursor on a metallic substrate. The coating precursor may be provided in discrete layers, or from a co-deposition process. Subsequent processing or heat treatment forms the nickel aluminide based coating from the coating precursor.

5 Claims, 2 Drawing Sheets

(56) References Cited

U.S. PATENT DOCUMENTS

| | | | |
|---|---|---|---|
| 2002/0132132 A1* | 9/2002 | Bose et al. | 428/632 |
| 2004/0157081 A1 | 8/2004 | Zhao | |
| 2004/0161628 A1* | 8/2004 | Gupta et al. | 428/633 |
| 2005/0100756 A1* | 5/2005 | Langan et al. | 428/617 |
| 2005/0271514 A1 | 12/2005 | Lee et al. | |
| 2006/0093801 A1 | 5/2006 | Darolia et al. | |
| 2008/0160208 A1* | 7/2008 | Maly et al. | 427/470 |
| 2008/0173206 A1* | 7/2008 | Langan et al. | 102/476 |
| 2011/0151140 A1* | 6/2011 | Hazel et al. | 427/576 |

* cited by examiner

NICKEL ALUMINIDE COATING SYSTEMS AND COATED ARTICLES

CROSS REFERENCE TO RELATED APPLICATIONS

This application claims priority and benefit of U.S. Provisional Patent Application Ser. No. 61/288,711 filed Dec. 21, 2009, the disclosure of which is incorporated herein by reference in its entirety.

BACKGROUND OF THE INVENTION

This invention relates generally to coating systems for metallic substrates, and more specifically to nickel aluminide coating systems and coated articles.

Nickel aluminide (NiAl) type coatings are discussed in U.S. Pat. Nos. 6,620,524 and 6,933,058 and US Patent Publication, 20070207339. Exemplary processes to provide a NiAl based overlay coating include cathodic arc (ion plasma) deposition techniques using sources having a generally homogenous composition. This process results in uniform chemistry through the coating thickness, but can lead to defects in the coating associated with macroparticle transfer and subsequent shadowing. Discussion of macroparticles from cathodic arc processing may be found in A. Anders, "Cathodic Arcs: From Fractal Spots to Energetic Condensation", Springer (2008).

The cathodic arc deposited NiAl coatings may suffer from macroparticles that are believed to reduce oxidation performance. Additionally, the consumable source (i.e., cathode) used in the deposition process is difficult to manufacture due to the high melting temperature, large freezing range, and low ductility (i.e., brittleness) of the NiAl material.

U.S. Pat. No. 6,964,791 discloses a two-step method for supplying a coating onto a metallic substrate. The method includes disposing a first coating layer onto said substrate comprising nickel, zirconium, and aluminum, and thereafter, disposing onto the first coating layer, a second coating layer comprising at least 90 atomic percent aluminum. Subsequent processing leads to the formation of a substantially single-phase reacted coating layer comprising nickel aluminide with a B2 structure. The reacted coating layer includes a higher aluminum concentration at the outer surface and a lower aluminum concentration near the coating/substrate interface.

The teachings of U.S. Pat. No. 6,964,791 demonstrate that substantially pure aluminum deposited over NiAl(CrZr) coating layer exhibits high interdiffusion when heated to 1079° C. (1975° F.), thus covering the macroparticles mentioned above. However, the coating exhibits a higher aluminum surface level and an aluminum compositional gradient throughout the thickness of the coating.

Further improvements in coatings and coating processes are still sought, in particular, to reduce costs, ease manufacturing difficulties, and shorten coating times. In addition, improvements in alloying capabilities are sought due to the brittle nature of NiAl materials.

BRIEF DESCRIPTION OF THE INVENTION

The above-mentioned need or needs may be met by exemplary embodiments, which provide nickel aluminide coating systems and coated articles.

An exemplary coating system includes a coating precursor disposed on a metallic substrate comprising an amount of nickel and at least one alloy element overlying the metallic substrate obtained from a first source and an amount of aluminum overlying the metallic substrate obtained from a second source, and, optionally, a ceramic thermal barrier coating overlying a coating formed after suitable processing of the coating precursor.

An exemplary coated article includes a metallic substrate and a coating on the substrate formed from a coating precursor, wherein the coating precursor includes an amount of nickel and at least one alloy element overlying the metallic substrate obtained from a first source and an amount of aluminum overlying the metallic substrate obtained from a second source.

Separation of a significant portion of the aluminum from the remainder of the coating composition in the consumable cathodes eliminates the difficulties associated with brittle NiAl cathodes.

BRIEF DESCRIPTION OF THE DRAWINGS

The subject matter, which is regarded as the invention, is particularly pointed out and distinctly claimed in the concluding part of the specification. The invention, however, may be best understood by reference to the following description taken in conjunction with the accompanying drawing figures in which:

DETAILED DESCRIPTION OF THE INVENTION

Exemplary embodiments are described herein with reference to the figures. In general terms, an exemplary coating is disposed on a metallic substrate by supplying the desired coating composition in at least two parts to provide a coating precursor. Subsequent processing of the coating precursor provides the desired coating.

Figure 1:
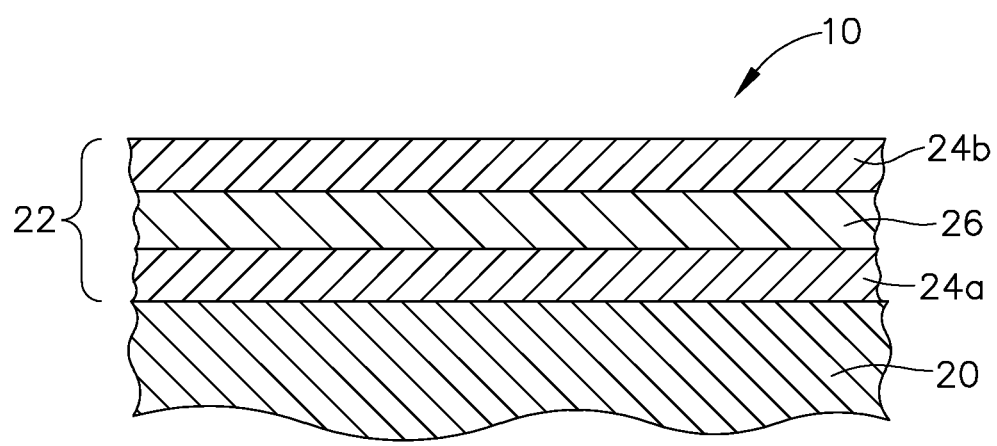
FIG. 1 is a schematic cross-sectional representation of a metallic substrate having an exemplary coating precursor disposed thereon.

FIG. 1 shows an exemplary article 10 including a substrate 20 having a layered coating precursor 22 disposed thereon. In an exemplary embodiment, coating precursor 22 includes at least one layer 24a comprised of a nickel alloy (NiX), a layer 26 comprised substantially of aluminum, and a layer 24b also comprised of the nickel alloy (NiX). In the illustrated embodiment, layer 26 is disposed between layers 24a and 24b. Additional layers (NiX or aluminum) may be provided as well to provide a suitable coating precursor 22. In other exemplary embodiments, the coating precursor can include a NiX layer 24a and aluminum layer 26 to meet the requirements of the desired coating.

In an exemplary embodiment, the coating composition, prior to deposition, is separated into at least two portions, and provided through separate "consumables", e.g., cathodes for cathodic arc (ion plasma) deposition. In an exemplary embodiment, the portions of the coating composition provided by the consumable are very different in composition. One portion is substantially pure aluminum (i.e., aluminum source), and the other portion is nickel plus other alloying elements (i.e., NiX source). For example, the other alloying elements may include those elements desired for environmental resistance, strengthening, and the like, and theoretically may be substantially free of aluminum. For example, in addition to nickel, the second portion may include alloying elements such as chromium, zirconium, hafnium, silicon, yttrium, or combinations thereof. Additional alloying elements may include titanium, tantalum, rhenium, lanthanum, cerium, calcium, iron, gallium, and the like to provide desired characteristics in the final coating. The second portion is designated as "NiX" herein, where X represents any one or more alloying elements.

In other exemplary embodiments, the other portion (i.e., NiX) may include some aluminum content at reduced levels as compared to prior consumables and less than an aluminum content that would be required absent the first source of aluminum. The reduced aluminum in the NiX source will still provide the desired ease of manufacturing and provide aluminum diffusion to heat macroparticles, etc. Provision of some of the required aluminum content in the NiX portion reduces the amount of aluminum from the first portion aluminum source) needed to reach the target composition, thus providing process flexibility.

In an exemplary embodiment, the coating composition is disposed onto the substrate through a multi-layering cathodic arc (ion plasma) deposition process. Subsequent processing and/or heat treatment are utilized to provide a dense coating wherein at least the aluminum is distributed throughout the coating thickness, rather than presenting a higher aluminum content at the surface. Preferably, the coating comprises a substantially uniform distribution of the alloying elements. In an exemplary embodiment, a three layer coating process is utilized. A first layer may utilize the NiX consumable, followed by deposition of Al, and thereafter, another NiX layer. The thickness of each deposited layer is dependent upon the desired final coating composition. The layered coating precursor may be subjected to a homogenization heat treatment at a predetermined temperature for sufficient time for the layers to interdiffuse into a dense coating. In an exemplary embodiment the heat treatment is performed at about 1079° C. (1975° F.).

In other exemplary embodiments, additional Al and/or NiX layers may be utilized to form the layered coating precursor, and subsequently processed to provide the desired coating. In an exemplary embodiment the layered coating precursor is provided in a sufficient thickness so that a total coating thickness is nominally between about 12.7-254 microns (about 0.5-10.0 mil). In other exemplary embodiments, the total coating thickness is between about 12.7-76.2 microns (about 0.5-3.0 mil). The layers from each of the respective sources may be uniform in thickness, or may vary in thickness in order to achieve the desired coating.

Although described in terms of providing a layered coating precursor, those with skill in the art will appreciate that co-depositing NiX and Al would provide a coating precursor having near infinite number of very fine layers. Thus any number of layers may be possible, as long the target composition requirements are achieved. Minimum number of layers is two: 24a and 26. Maximum number of layers can be infinite where for example NiX and Al are co-deposited at the same time making a near infinite number of very fine layers. Any number of layers in between are possible as long as the final composition requirements are achieved.]

Figure 2:
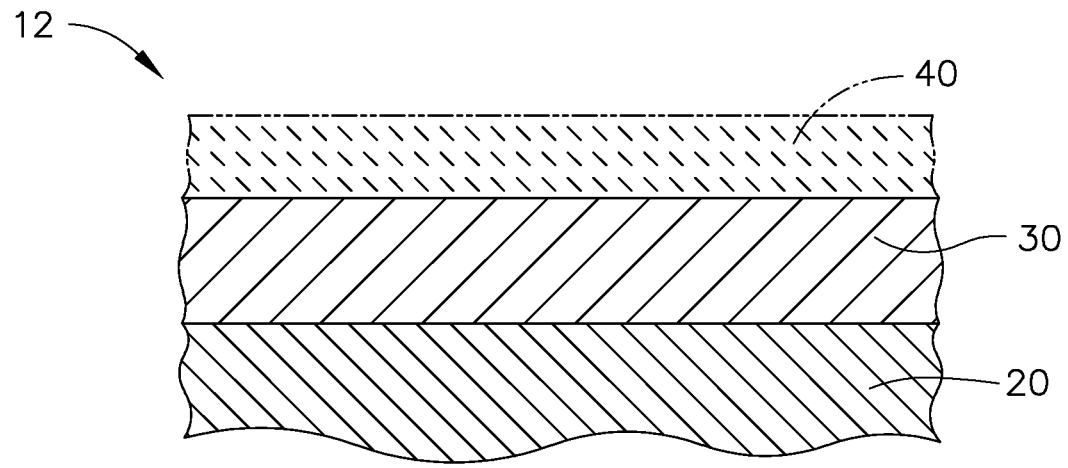
FIG. 2 is a schematic cross-sectional representation of the metallic substrate of FIG. 1 having an exemplary coating disposed thereon.

FIG. 2 illustrates a coated article 12 including the substrate 20 and a coating 30, formed from the layered coating precursor. An optional ceramic layer 40, shown in phantom, may be included on the coated article 12.

Exemplary coating compositions disclosed herein represent target or nominal compositions obtained by disposing layers of the NiX and Al onto the substrate. Table I lists exemplary compositions of as-deposited coatings, wherein a significant amount of the aluminum portion is supplied from a first consumable source (e.g., cathode) and the remaining portion is provided through one or more additional consumable sources (e.g., cathodes). The exemplary coating compositions provided in Table I generally correspond to the coating compositions set forth in U.S. Pat. No. 6,153,313, incorporated herein in its entirety.

In an exemplary embodiment, the as-deposited coating, applied via at least two different consumables (e.g., Al and NiX), includes zirconium content of at least 0.2 atomic percent in addition to nickel and aluminum. In other exemplary embodiments, the zirconium content is in the range of at 0.2 to 0.5 atomic percent, as set forth in U.S. Pat. No. 6,255,001, which is incorporated herein in its entirety.

TABLE I

|  | A | B | C |
|---|---|---|---|
| Aluminum | 30-60%* | 35-55% | 35-50% |
| Chromium | To 25% | 0.5-25% | 0.5-15% |
| Titanium | To 5% | 0.1-5.0% | 0.1-5.0% |
| Tantalum | To 5% | 0.1-5.0% | 0.1-3.0% |
| Silicon | To 5% | 0.1-5.0% | 0.1-2.0% |
| Calcium | To 1% | 0.01-1.0% | 0.01-1.0% |
| Hafnium | To 2% | 0.01-2.0% | 0.01-2.0% |
| Iron | To 1% | 0.02-0.5% | 0.02-0.5% |
| Yttrium | To 1% | 0.01-1.0% | 0.01-1.0% |
| Gallium | To 0.5% | 0.02-0.2% | 0.02-0.2% |
| Zirconium | To 0.5% | 0.01-0.5% | 0.01-0.5% |
| Nickel | Balance | Balance | Balance |

*All values given in atomic percent of an as-deposited coating

In an exemplary embodiment, the as-deposited coating, applied via at least two different consumables (e.g., Al and NiX), includes a chromium content in a range of about 2 to 15 atomic percent, and a zirconium content of about 0.1 to 1.2 atomic percent, the balance nickel as set forth in U.S. Pat. No. 6,291,084, incorporated herein in its entirety. The balance includes an aluminum content of about 30 to 60 atomic percent of the as-deposited coating, preferably about 30 to 50 atomic percent, and more preferably an atomic ratio of 1:1 with the nickel content.

In an exemplary embodiment, the as-deposited coating, applied via at least two different consumables (e.g., Al and NiX), includes aluminum, nickel, and at least two modifying elements selected from zirconium, hafnium, yttrium, and silicon. In an exemplary embodiment, zirconium is at least one of the selected modifying elements. In an exemplary embodiment, the modifying elements, if present, may comprise from about 0.1 to about 5, more preferably from about 0.1 to about 3, and most preferably from about 0.1 to about 1, percent by weight of the as-deposited coating composition. In an exemplary embodiment, yttrium, when present, is included in an amount of from about 0.1 to about 1 percent by weight of the as-deposited coating. Exemplary coating compositions are set forth in U.S. Pat. No. 6,579,627, incorporated herein in its entirety.

Figure 3:
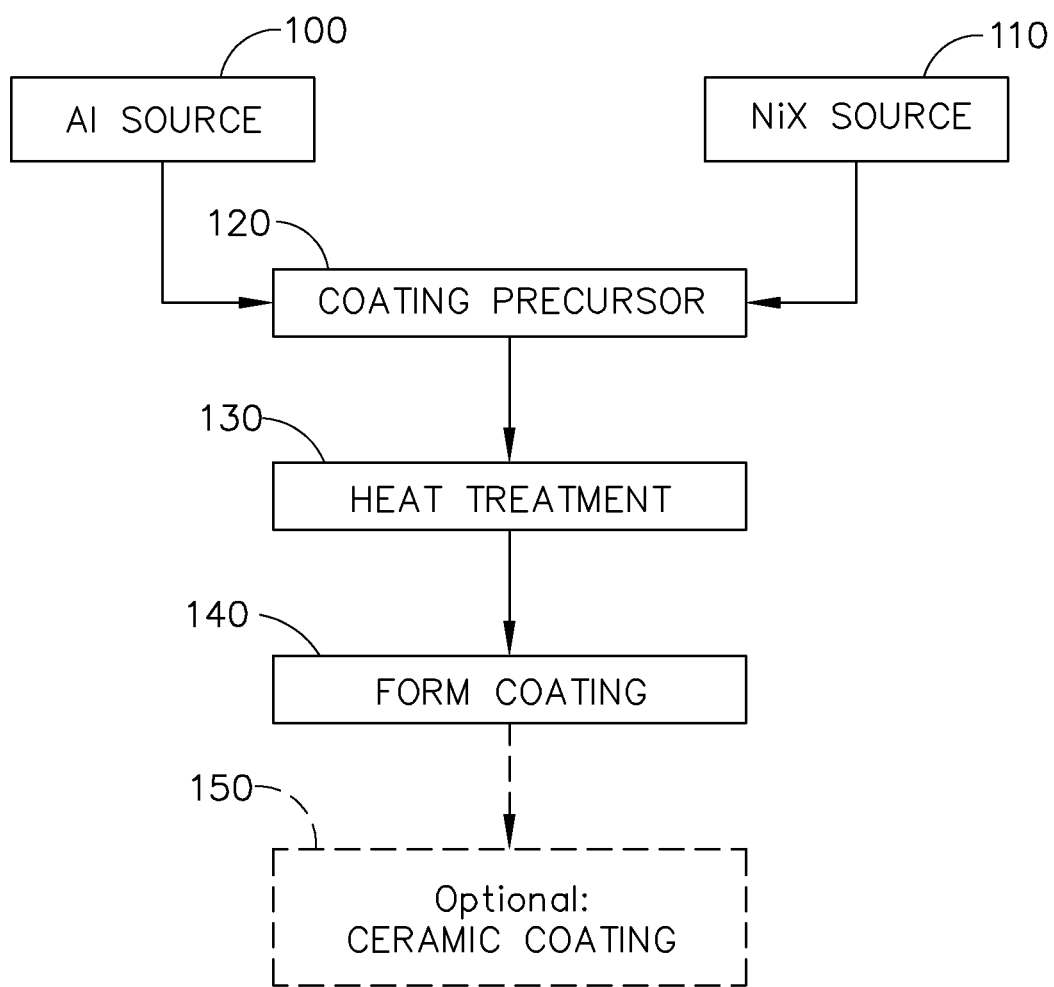
FIG. 3 is a flowchart illustrating an exemplary process for forming a coating in accordance with embodiments disclosed herein.

FIG. 3 illustrates and exemplary process for providing a coated article. In Step 100, an aluminum source (e.g., consumable cathode) is provided. In step 110, a nickel alloy (NiX) source (e.g., consumable cathode) is provided. The aluminum and NiX are provided on a substrate surface in the form of a layered coating precursor in Step 120. The substrate/coating precursor undergo subsequent processing, such as a heat treatment (Step 130) under sufficient time and temperature conditions to form a nickel aluminide coating on the substrate (Step 140).

The exemplary coatings disclosed herein may be particularly suitable for use as bond coats disposed between a substrate and an overlying thermal barrier coating, for example, 7 YSZ, as illustrated by optional Step 150. Alternately, the exemplary coatings disclosed herein may be suitable for use as environmental coatings (without an overlying thermal barrier coating) as will be appreciated by those having skill in the relevant art. Exemplary metallic substrates include nickel base superalloys, cobalt base superalloys, and iron base superalloys.

Thus, with appropriate thicknesses of deposited layers, and subsequent processing (e.g., diffusion heat treatment), a nickel aluminide based coating may be provided on a metallic substrate. Separating a significant portion of the aluminum from the remainder of the coating composition as disclosed herein eliminates the difficulties associated with brittle NiAl cathodes, eases manufacturing difficulties, and shortens coating times.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A coating system for a metallic substrate, the coating system comprising:
   a coating precursor, wherein the coating precursor includes
      at least a first layer of nickel and at least one alloy element overlying and in contact with the metallic substrate and obtained from a first source;
      an intermediate layer of aluminum overlying and in contact with the first layer and obtained from a second source; and
      a second layer of the nickel and at least the one alloy element disposed in contact with and overlying the intermediate aluminum layer;
   wherein amounts of nickel and aluminum in the coating precursor are sufficient to cause the coating precursor to form a nickel aluminide-based coating after heat treating and cause aluminum to be uniformly distributed throughout the coating thickness.

2. The coating system according to claim 1 wherein the coating precursor includes a plurality of inter-dispersed fine layers of nickel and at least one alloy element and aluminum provided by co-deposition of the nickel and at least one alloy element content from the second source and the aluminum content from the first source.

3. The coating system according to claim 1 wherein the second source includes at least one alloy element selected from the group consisting of chromium, zirconium, hafnium, silicon, yttrium, titanium, tantalum, rhenium, lanthanum, cerium, calcium, iron, gallium, and combinations thereof.

4. The coating system according to claim 1 wherein the coating precursor includes sufficient quantities of nickel and at least one alloy element and aluminum to provide the coating formed therefrom with a thickness of between about 12.7-254 microns, inclusive.

5. The coating system according to claim 4 wherein the coating thickness is between about 12.7-76.2 microns, inclusive.

\* \* \* \* \*